United States Patent [19]

Koshiyama

[11] Patent Number: 5,815,655
[45] Date of Patent: Sep. 29, 1998

[54] DEVICE FOR GENERATING ERROR PATH LIST AND METHOD OF EXTRACTING THE WORST PATHS

[75] Inventor: Akira Koshiyama, Yokohama, Japan

[73] Assignee: Fujitsu Limited, Kawasaki, Japan

[21] Appl. No.: 808,672

[22] Filed: Feb. 28, 1997

Related U.S. Application Data

[63] Continuation of Ser. No. 418,573, Apr. 6, 1995, abandoned.

[30] Foreign Application Priority Data

May 13, 1994 [JP] Japan .................................. 6-099749

[51] Int. Cl.$^6$ .................................................. G06F 11/00
[52] U.S. Cl. .............................. 395/183.21; 395/183.19; 395/185.09; 371/22.1; 364/489
[58] Field of Search ........................ 395/183.21, 183.19, 395/185.08, 185.09, 183.13, 183.16; 371/22.1, 22.34, 22.36, 28, 61, 62; 364/489, 490

[56] References Cited

U.S. PATENT DOCUMENTS

| | | | |
|---|---|---|---|
| 3,603,771 | 9/1971 | Isett | 235/151 |
| 4,564,943 | 1/1986 | Collins et al. | 371/28 |
| 4,916,627 | 4/1990 | Hathaway | 364/490 |
| 4,924,430 | 5/1990 | Zasio et al. | 364/578 |
| 4,970,664 | 11/1990 | Kaiser et al. | 364/521 |
| 5,172,377 | 12/1992 | Robinson et al. | 371/22.3 |
| 5,191,541 | 3/1993 | Landman et al. | 364/489 |
| 5,210,700 | 5/1993 | Tom | 364/489 |
| 5,237,514 | 8/1993 | Curtin | 364/490 |
| 5,404,311 | 4/1995 | Isoda | 364/490 |
| 5,452,228 | 9/1995 | Arakawa et al. | 364/489 |
| 5,457,638 | 10/1995 | Ashar et al. | 364/490 |
| 5,471,152 | 11/1995 | Gheewala et al. | 324/758 |
| 5,493,522 | 2/1996 | Rosenburg | 364/746 |
| 5,521,837 | 5/1996 | Frankle et al. | 364/491 |
| 5,572,437 | 11/1996 | Rostoker et al. | 364/489 |
| 5,629,859 | 5/1997 | Agarwala et al. | 371/22.1 |

OTHER PUBLICATIONS

Muraoka et al., "ACTAS: An Accurate Timing Analysis System for VLSI", 22nd Design Automation Conf., IEEE, pp.–152–158, 1985.

Primary Examiner—Joseph Palys
Attorney, Agent, or Firm—Staas & Halsey

[57] ABSTRACT

A device for generating an error path list for analyzing delay times of paths generating errors, which paths connect first nodes with second nodes, includes a reading unit for reading information on the paths and the delay times thereof, a representative-path extraction unit for extracting worst paths in terms of the delay times as representative paths by using the information, and an output unit for generating the error path list reporting the representative paths.

11 Claims, 8 Drawing Sheets

F I G. 5
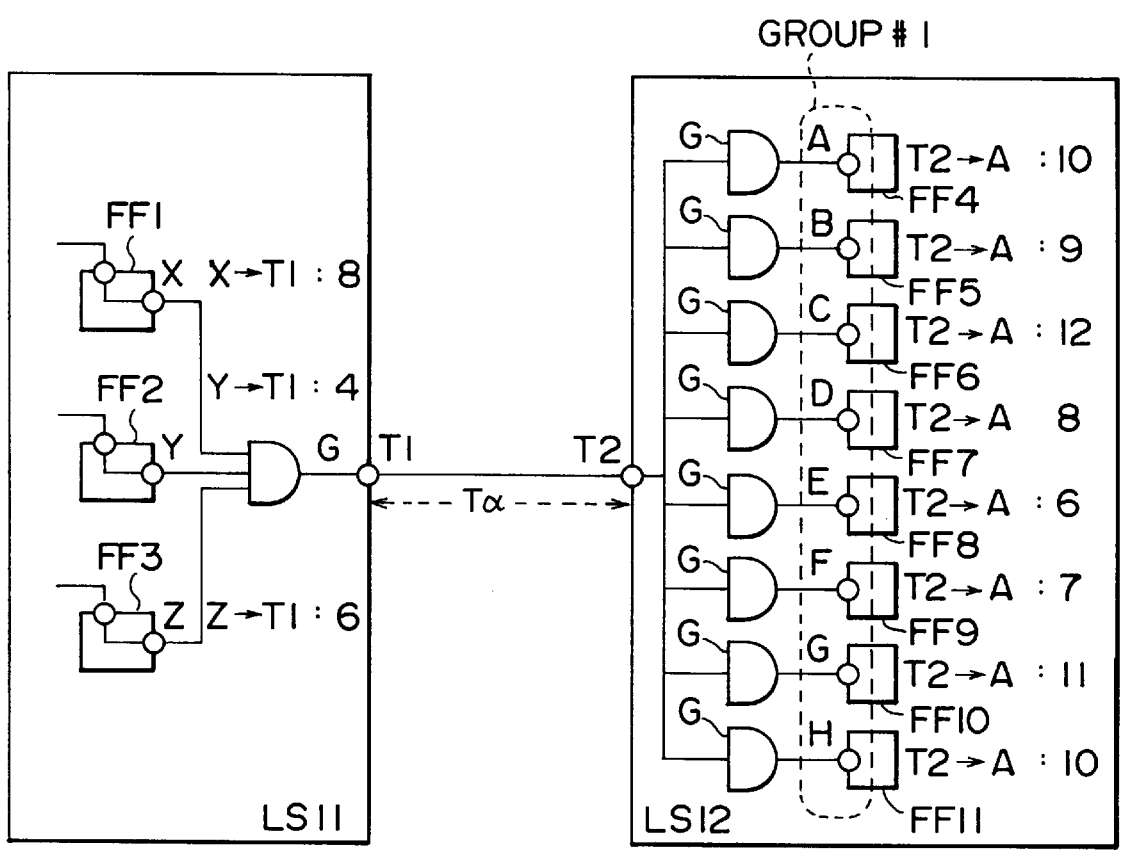

F I G. 6
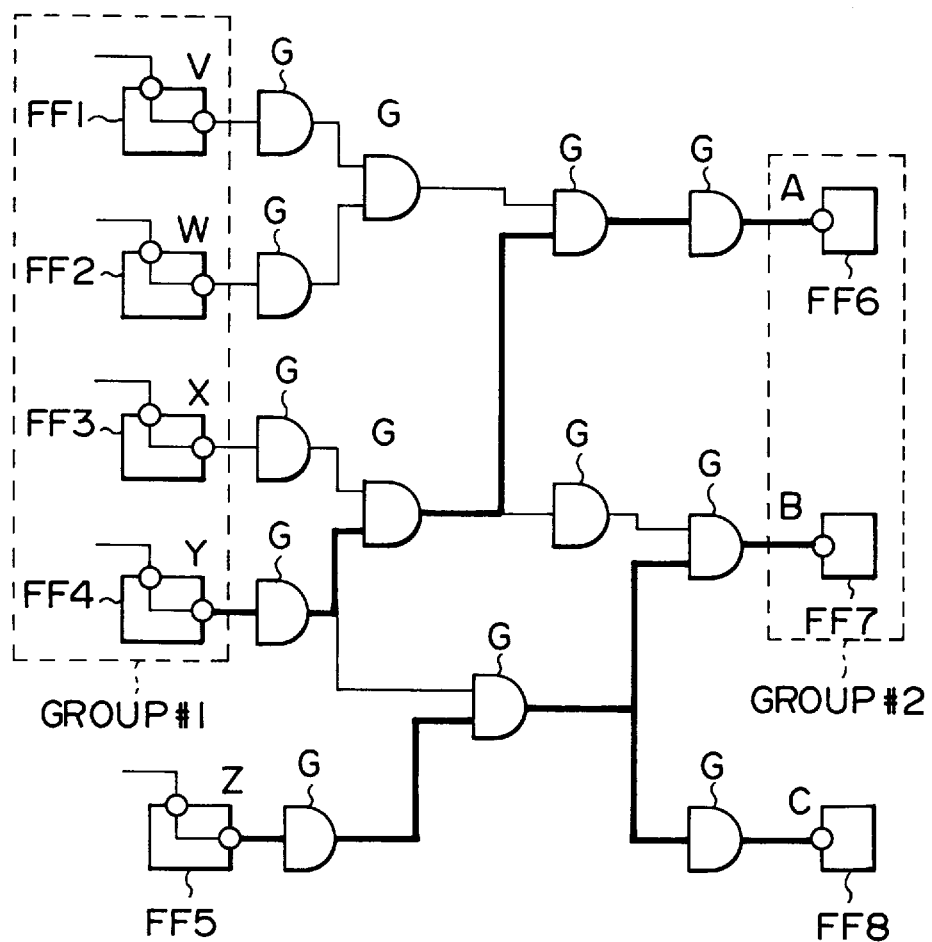

FIG. 7A

| START | TARGET | DELAY |
|---|---|---|
| V | A | ∴ |
| W | A | ∴ |
| W | A | ∴ |
| X | A | ∴ |
| X | B | ∴ |
| Y | A | ∴ |
| Y | B | ∴ |
| Y | C | ∴ |
| Z | B | ∴ |
| Z | C | ∴ |

FIG. 7B

| START | TARGET | DELAY |
|---|---|---|
| Y | A | ∴ |
| Z | C | ∴ |

FIG. 7C

| START | TARGET | DELAY |
|---|---|---|
| GROUP#1 |  |  |
| Y | A | ∴ |

FIG. 7D

| START | TARGET | DELAY |
|---|---|---|
|  | GROUP#2 |  |
| Y | A | ∴ |
| Z | B | ∴ |

FIG. 7E

| START | TARGET | DELAY |
|---|---|---|
| GROUP#1 | GROUP#2 |  |
| Y | A | ∴ |

FIG. 8A

| START | TARGET | DELAY |
|-------|--------|-------|
| V | A | : : : |
| W | A | : : : |
| X | A | : : : |
| X | B | : : : |
| Y | A | : : : |
| Y | B | : : : |

FIG. 8B

| START | TARGET | DELAY |
|-------|--------|-------|
| V | A | : : : |
| Y | B | : : : |

FIG. 8C

| START GROUP#1 | TARGET | DELAY |
|---------------|--------|-------|
| V | A | : : : |
| Y | B | : : : |

FIG. 8D

| START | TARGET GROUP#2 | DELAY |
|-------|----------------|-------|
| V | A | : : : |
| Y | B | : : : |

FIG. 8E

| START GROUP#1 | TARGET GROUP#2 | DELAY |
|---------------|----------------|-------|
| V | A | : : : |
| Y | B | : : : |

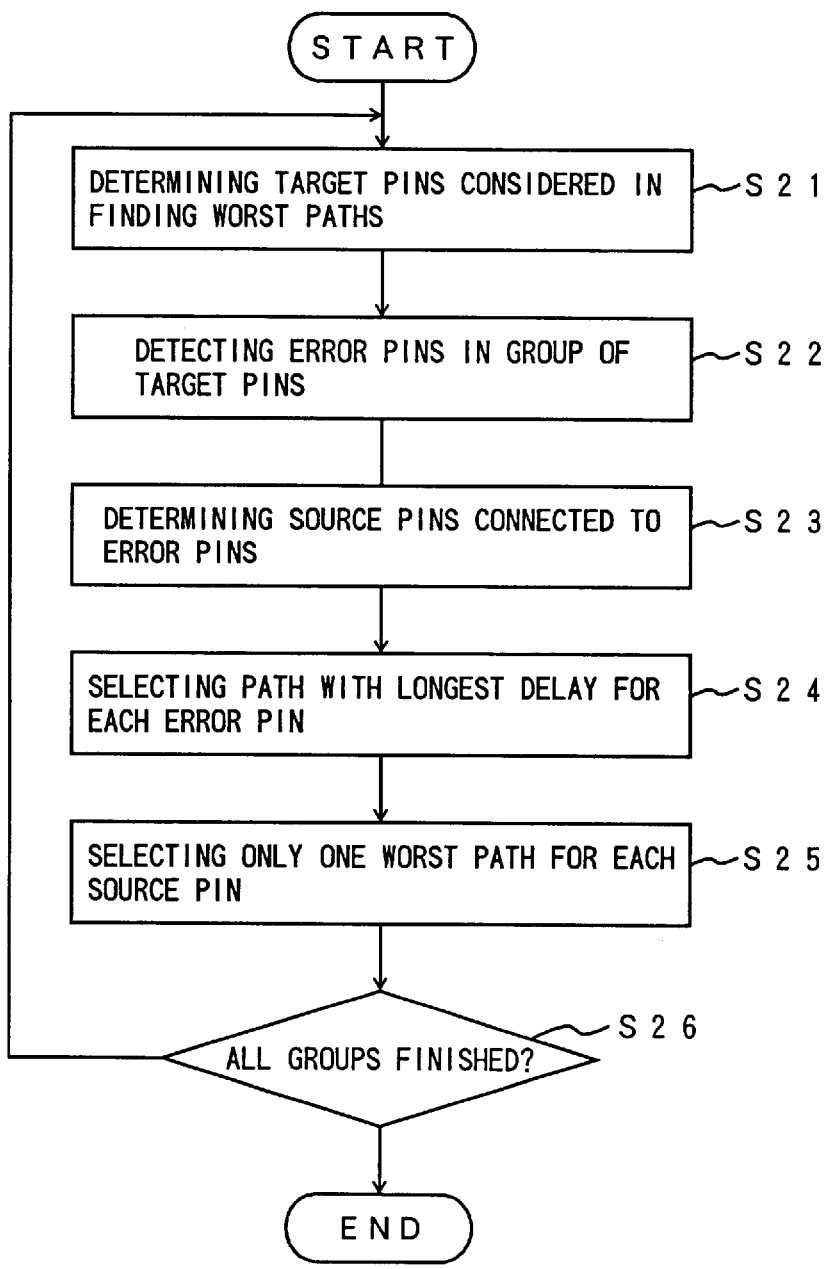

DEVICE FOR GENERATING ERROR PATH LIST AND METHOD OF EXTRACTING THE WORST PATHS

This application is a continuation of application Ser. No. 08/418,573, filed Apr. 6, 1995, now abandoned.

BACKGROUND OF THE INVENTION

1. Field of the Invention

The present invention generally relates to devices for performing a delay time analysis on LSI circuits by using a logic simulator and for outputting a result of the analysis as a delay/racing error list. The present invention particularly relates to a device for outputting a delay/racing error list which helps in the determination of causes of errors by reporting only the worst paths.

2. Description of the Prior Art

LSI circuits in various devices are connected with each other through an inter-LSI network. In such connections, flip-flops (FFs) coupled with each other across the LSI circuits can be categorized into two groups, i.e., FFs for sending signals (hereinafter called source FFs) and FFs for receiving signals (hereinafter called target FFs).

As machine cycles of the devices and operation speeds of the LSI circuits increase, time delays created in the inter-LSI network become large relative to the total delay time between the source FFs to the target FFs. When a delay time of one segment of the inter-LSI network is so large as to create an error, all paths connected to that segment are detected as errors in a delay check by logic simulators. In such a case, all of these FFs end up being named on an error list.

In incipient stages of a designing process, generally, there can be a large number of paths causing errors, so that an exhaustive error list can be generated. Detection of the cause of the errors based on such an enormous error list is difficult and time consuming, requiring a large number of steps for analysis.

Since only the indexes of the FFs are reported in the error list as identification information, these FFs must be checked individually. In other words, it is difficult to check these FFs in such an organized manner that FFs of the same register or the same block are treated as belonging to the same group.

Thus, designers of the devices have to take care of all these errors by analyzing one path after another, even if all the errors are created by a single segment of the inter-LSI network.

In summary, a large amount of error path information is generated in the logic simulators of the prior art, especially when the delay time of the inter-LSI network is so large as to cause an error. Also, the error path information contains only indexes for indicating FFs. These inadequacies make the analysis of the errors difficult and time consuming.

Accordingly, there is a need in the field of the logic simulators for a delay/racing-error-list generation device which can list only the worst paths as representatives of all the error paths so as to able to decrease the number of steps for analyzing the errors.

Also, there is a need for a delay/racing-error-list generation device which can make groups of FFs contained in a circuit to be analyzed, and list only the worst paths as representatives of paths regarding selected groups so as to be able to decrease the number of steps for analyzing the errors.

Furthermore, there is a need for a method of extracting the worst paths which can select the worst paths as representatives of all the error paths.

SUMMARY OF THE INVENTION

Accordingly, it is a general object of the present invention to provide a delay/racing-error-list generation device which can satisfy the needs described above.

It is another and more specific object of the present invention to provide a delay/racing-error-list generation device which can list only the worst paths as representatives of all the error paths so as to able to decrease the number of steps for analyzing the errors.

In order to achieve the above objects according to the present invention, a device for generating an error path list for analyzing delay times of paths generating errors, which paths connect first nodes with second nodes, includes a reading unit for reading information on the paths and the delay times thereof, a representative-path extraction unit for extracting the worst paths in terms of the delay times as representative paths by using the information, and an output unit for generating the error path list reporting the representative paths. Furthermore, each of the worst paths has the longest delay time among the worst error paths connected to a corresponding one of the first nodes, and each of the worst error paths is a path having the longest delay time among the paths connected to a corresponding one of the second nodes.

In the above-described device according to the present invention, paths with the longest delay time are extracted as representative paths by selecting the worst path for a first node from the worst error paths connected to the first node, which worst error paths are obtained for each second node. Thus, a path causing the errors can be easily found, which results in the number of steps for analysis being significantly reduced.

It is still another object of the present invention to provide a delay/racing-error-list generation device which can make groups of FFs contained in a circuit to be analyzed, and list only the worst paths as representatives of paths regarding selected groups so as to be able to decrease the number of steps for analyzing the errors.

In order to achieve the above object according to the present invention, the device described above further includes a grouping unit for making first groups of the first nodes and second groups of the second nodes, wherein the representative-path extraction unit extracts the worst paths for each of the second groups, and the error path list reports only the representative paths relating to the first groups with corresponding names of the first groups and second groups.

In the above-described device according to the present invention, both the first nodes and the second nodes can be grouped in accordance with an instruction given by the designer. Then, paths with the longest delay time are selected as representative paths for each of the second groups. Within a second group, the selection of the representative paths is made in the same manner as in the device described earlier. The representative paths which are connected to the grouped first nodes are reported in the error path list with the names of the first groups and the second groups. Thus, the designer can obtain the error path list which is organized in accordance with the grouping of the nodes. This leads to an easy detection of a cause of the errors and to the number of steps for analysis being significantly reduced.

It is yet another object of the present invention to provide a method of extracting the worst paths which can select the worst paths as representatives of all the error paths.

In order to achieve the above object according to the present invention, a method of extracting the worst paths in terms of delay times among paths generating errors, which paths connect first nodes with second nodes, includes the steps of receiving information on the paths and the delay times thereof, selecting the worst error paths, each of which has the longest delay time among the paths connected to a corresponding one of the second nodes, and selecting the worst paths, each of which has the longest delay time among the worst error paths connected to a corresponding one of the first nodes.

In the method described above, the worst paths can be selected as representatives of all the error paths.

Other objects and further features of the present invention will be apparent from the following detailed description when read in conjunction with the accompanying drawings.

BRIEF DESCRIPTION OF THE DRAWINGS

FIG. 5 is a circuit diagram for explaining a process of extracting the worst paths by the error-path processing/display unit of FIG. 3;

FIG. 6 is another circuit diagram for explaining the process of extracting the worst paths by the error-path processing/display unit of FIG. 3;

FIGS. 7A through 7E are illustrative drawings showing error path lists obtained for the circuit of FIG. 6 according to the prior art and the embodiments of the present invention;

FIGS. 8A through 8E are illustrative drawings showing error path lists obtained for the circuit of FIG. 6 under different conditions from those of FIGS. 7A through 7E; and FIG. 9 is a flowchart of the process of extracting the representative paths by the error-path processing/display unit of FIG. 3.

DESCRIPTION OF THE PREFERRED EMBODIMENTS

In the following, a principle and embodiments of the present invention will be described with reference to the accompanying drawings.

Figure 1:
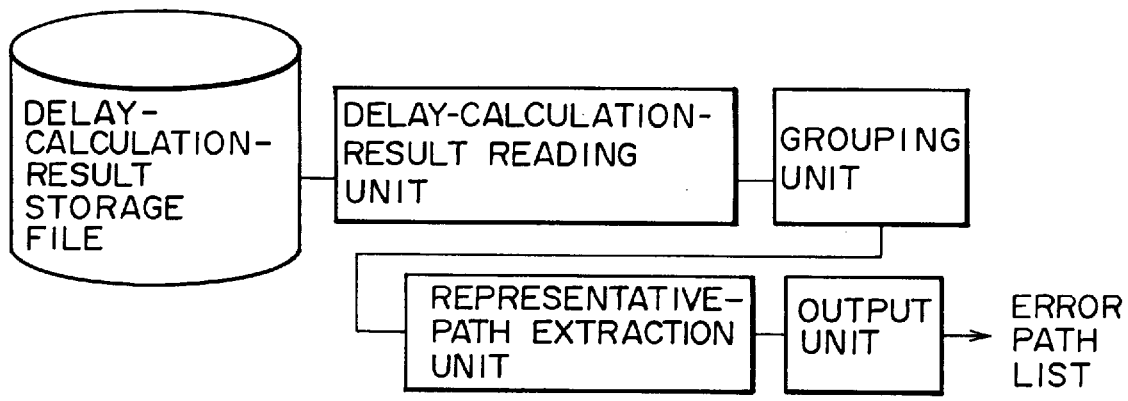
FIG. 1 is a block diagram of a delay/racing-error-list generation device according to a principle of the present invention.

FIG. 1 shows a block diagram of a delay/racing-error-list generation device according to a principle of the present invention. As shown in FIG. 1, the delay/racing-error-list generation device includes a delay-calculation-result storage file 1, a delay-calculation-result reading unit 2, a grouping unit 3 grouping FFs contained in a circuit to be analyzed, a representative-path extraction unit 4 extracting paths with the longest delay times as representative paths, and an output unit 5 generating an error path list naming the representative paths.

The delay/racing-error-list generation device might not include the grouping unit 3. In such a case, the delay-calculation-result reading unit 2 reads delay-calculation-results from the delay-calculation-result storage device 1. The representative-path extraction unit 4 selects paths with the longest delay times as the representative paths by using the delay-calculation result. In selecting each of these representative paths, first, the worst path is selected for each target pin. Then, if there are more than one of the worst paths connected to a single source pin, delay times of these paths are compared with each other. Thus, only one worst path remains for each source pin. Here, the term "source pin" refers to a pin of a source FF, and the term "target pin" refers to a pin of a target FF.

In a case where the grouping unit 3 is provided for the delay/racing-error-list generation device, the grouping unit 3 groups FFs contained in a circuit to be analyzed into groups based on resisters, functional blocks, or LSI circuits to which they belong. Selection of a type of groups is made in accordance with an instruction given by a designer of the circuit.

Figure 2:
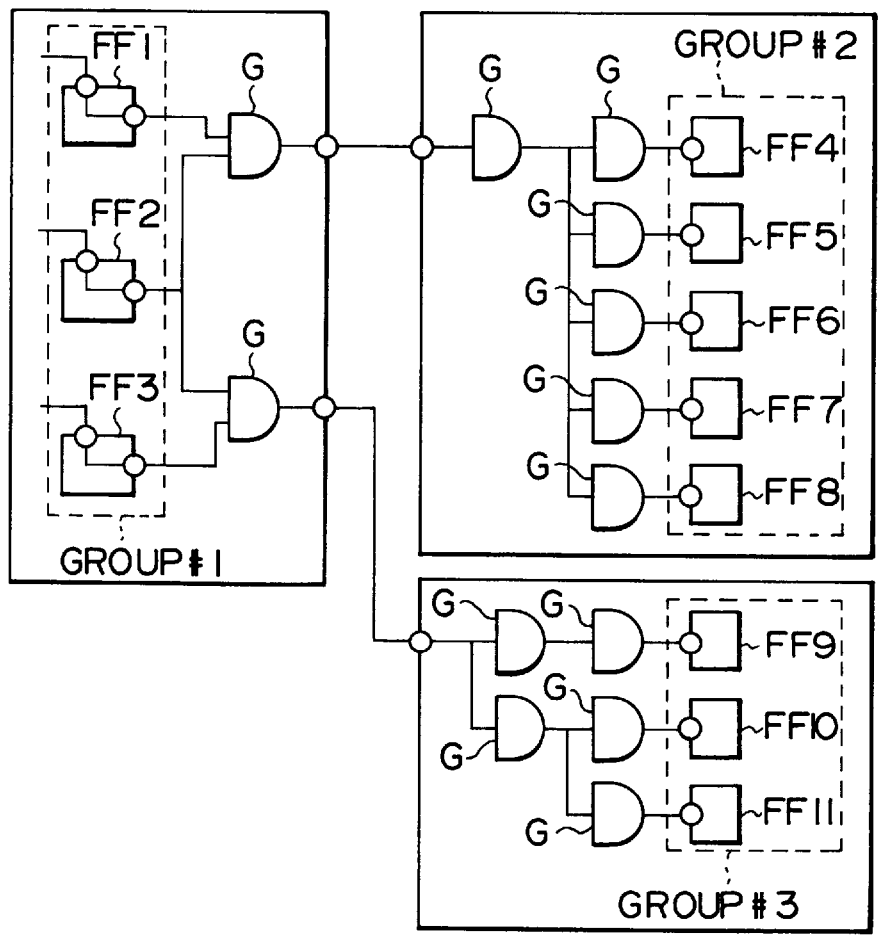
FIG. 2 is a circuit diagram for explaining how the worst paths are extracted in the device of FIG. 1.

FIG. 2 shows a circuit diagram for explaining how worst paths are extracted.

[CASE OF NO GROUPING OF FFs]

There are sixteen paths in total between source FFs FF1 through FF3 and target FFs FF4 through FF11. That is, these paths are paths from the FF1 to the FF4, the FF5, . . . , and the FF8, paths from the FF2 to the FF4, the FF5, . . . , and the FF8, paths from the FF2 to the FF9, the FF10, and the FF11, and, finally, paths from the FF3 to the FF9, the FF10, and the FF11.

Assume that all these paths generate errors. First, the worst paths are selected for each of the target FFs FF4 through FF11. For the target FF FF4, for example, the path from the FF1 to the FF4 and the path from the FF2 to the FF4 are compared with each other, so that one of these is selected as the worst path. In the same manner, the worst paths are obtained for all the target FFs.

In the circuit of FIG. 2, the worst paths for the target FFs FF4 through FF8 should be connected to the same source FF. (Because, if the path from the FF1 to the FF4 is the worst path for the FF4, for example, the path from the FF1 to a gate G should have the longer delay time than does the path from the FF2 to the gate G.) Thus, the worst paths from the FF1 to the FF4 through the FF8 are compared with each other, so that the worst path of all is selected as a representative path for the FF4 through the FF8.

In the same manner, the worst paths for the target FFs FF9 through FF11 should be connected to the same source FF. These paths are compared to each other to determine the representative path for the FF9 through the FF11.

The representative paths extracted as in the above are sorted by the output device 5 based on indexes of the FFs or the delay times, and, then, outputted as an error path list.

When all the paths between the FF1 through the FF3 and the FF4 through the FF11 generate errors, all these paths are reported in an error list in the prior art. In the present invention, however, the worst paths among all the paths are extracted as representative paths.

[CASE OF GROUPING OF FFs]

In this case, the FFs are grouped in accordance with an instruction given by a designer. The grouping of the FFs may be based on registers, functional blocks, LSI circuits, or whatever other units are desired.

Assume that the FFs are grouped into a group #1 consisting of the source FFs FF1 through FF3, a group #2 consisting of the target FFs FF4 through FF8, and a group #3 consisting of the target FFs FF9 through FF11.

Between the group #1 and the group #2, there are ten paths. The worst paths are selected as representative paths for these ten paths by using the same procedure as that of the no-grouping case. In the example of FIG. 2, there should be only one representative path for the paths connecting the group #1 with the group #2 for the same reason described in the no-grouping case.

In the same manner, the worst path among the paths connecting the group #1 with the group #3 is extracted as a representative path.

The representative paths extracted as in the above are sorted by the output device 5 based on indexes of the FFs or the delay times, and, then, outputted as an error path list.

Both cases described above have resulted in the same error list, because the grouping of the FFs in the second case are the same as the grouping of the FFs implicitly made in the first case. If the grouping of the FFs had been different between these two cases, the results also would have been different. Such an example will be described later with regard to the embodiments of the present invention.

In the first case, paths with the longest delay time are extracted as representative paths by selecting the worst path for a source pin from the worst error paths connected to the source pin, which worst error paths are determined for each target pin. Thus, a path causing the errors can be easily found, which results in the number of steps for analysis being significantly reduced.

In the second case, FFs in a circuit are grouped based on registers, functional blocks, LSI circuits, etc., to which the FFs belong, in accordance with an instruction given by a designer of the circuit. Then, paths with the longest delay time are selected for each group or for each pair of groups as representative paths. The selection of the paths for one group or for one pair of groups is made by selecting the worst path for a source pin from the worst error paths connected to the source pin, which worst error paths are determined for each target pin. Thus, the designer of the circuit can obtain an error path list which is organized in accordance with the grouping of the FFs. This leads to an easy detection of a cause of the errors and to the number of steps for analysis being significantly reduced.

The embodiments of the present invention will be described below with reference to the accompanying drawings.

Figure 3:
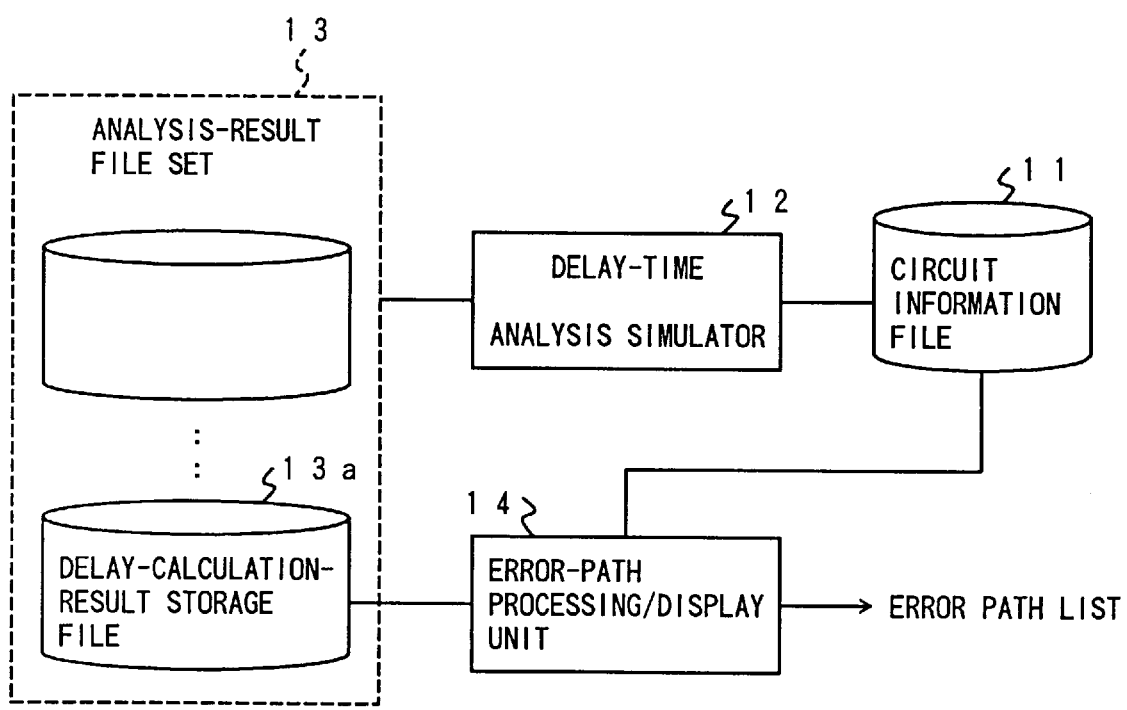
FIG. 3 is a block diagram of a system realizing the delay/racing-error-list generation device of FIG. 1 according to embodiments of the present invention.

FIG. 3 shows a block diagram of a system realizing a delay/racing-error-list generation device according to the embodiments of the present invention. In FIG. 3, the system includes a circuit information file 11 storing circuit information for a delay-time analysis, a delay-time analysis simulator 12, an analysis-result file set 13 including a delay-calculation-result storage file 13a, and an error-path processing/display unit 14.

The delay-time analysis simulator 12 carries out a delay-time analysis based on circuit information stored in the circuit information file 11, and, then, stores a result of the analysis into the analysis-result file set 13. When there is an error caused by delays of paths, error path information is stored in the delay-calculation-result storage file 13a.

The error-path processing/display unit 14 extracts the worst paths as representative paths based on the error path information stored in the delay-calculation-result storage file 13a. Then, the error-path processing/display unit 14 outputs the representative paths as an error path list.

Figure 4:
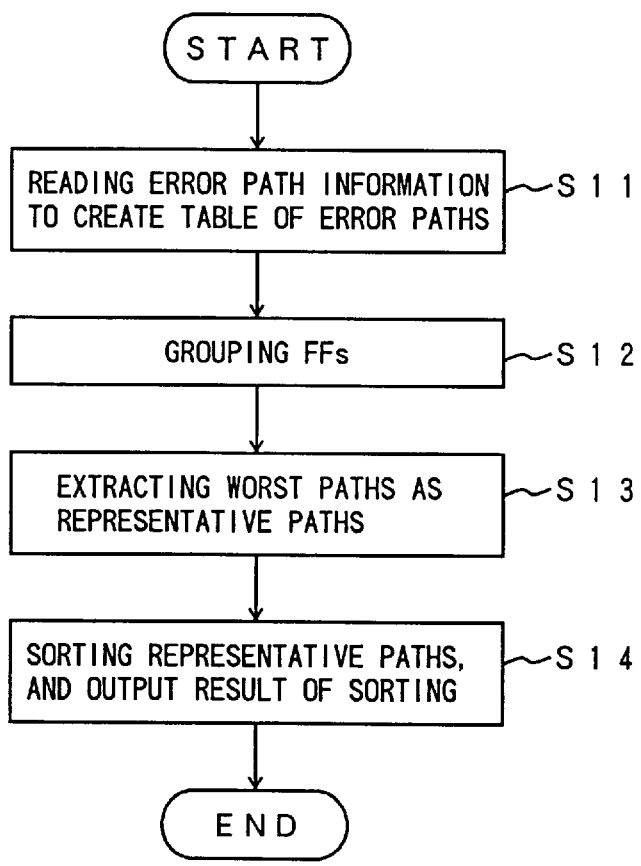
FIG. 4 is a flowchart of a process carried out by an error-path processing/display unit of FIG. 3.

FIG. 4 shows a flowchart of a process carried out by the error-path processing/display unit 14.

At a step S11, the error path information is read from the delay-calculation-result storage file 13a so as to create a table of error paths.

At a step S12, FFs contained in a circuit to be analyzed are grouped in accordance with an instruction given by a designer. The grouping of the FFs are based on, for example, registers, functional blocks, or LSI circuits to which the FFs belong.

At a step S13, the worst paths are extracted as representative paths by selecting the worst path for a source pin from the worst error paths connected to the source pin, which worst error paths are determined for each target pin.

At a step S14, the representative paths are sorted according to indexes or delay times, and, then, are outputted as an error path list.

FIG. 5 shows a circuit diagram for explaining the process of extracting the worst paths by the error-path processing/display unit 14. In the figure, integrated circuits are denoted by LSI1 and LSI2, which have pins T1 and T2, respectively. FFs are denoted by FF1 through FF11, whose pins are denoted by X through Z and A through H. Also, G refers to gates.

In FIG. 5, a delay time between the pins T1 and T2 is denoted by $T\alpha$. Delay times from the pins X, Y, and Z to the pin T1 are 8, 4, and 6, respectively. Also, delay times from the pin T2 to the pins A through H are 10, 9, 12, 8, 6, 7, 11, and 10, respectively.

FIRST EMBODIMENT

A first embodiment of the present invention is characterized by a process of extracting the worst paths in the error-path processing/display unit 14. In the first embodiment, paths which have the longest total delay time are extracted as representative paths, by selecting the worst path for each source pin from the worst error paths connected to a source pin, which worst error paths are determined for each target pin.

With reference to FIG. 5, assume all the paths are reported as error paths. First, the worst paths are selected for each of the target pins A through H. For example, for the target pin A, the path from the pin X to the pin A is selected as the worst path, because the path from the pin X to the pin T1 has the longest time delay among the paths connecting the pins X, Y, and Z with the pin T1. The worst paths which are obtained in the same manner for each of the target pins A through H have the same source pin X. Thus, these worst paths are compared with each other, resulting in the representative path from the pin X to the pin C.

This process of finding the worst (representative) path can be conducted progressively on each segment of the paths, as will be described below.

In order to find the worst path in FIG. 5, first, the delay times from the pins X, Y, and Z to the pin T1 are compared with each other. The path from the pin X to the pin T1 has the worst delay time of 8 in this example, so that this path is selected as the worst path in this locality.

The delay time from the pin T1 to the pin T2 is $T\alpha$, as described above.

Next, the delay times from the pin T2 to the pins A through H are compared with each other. The path from the pin T2 to the pin C has the worst delay time of 12 in this example, so that the path from the pin X to the pin C is found to be the worst path having the longest total delay time.

Following either method of obtaining the worst path, the representative path(s) is sorted according to indexes or delay times, and, then, is output as an error path list.

In the example of FIG. 5, the delay time of the worst path is 20 plus $T\alpha$. Thus, if the delay time $T\alpha$ is too large, all the paths from the source FFs to the target FFs are listed as error paths in the prior art. This enormous amount of error path information makes it difficult to analyze the error paths in an organized manner.

In the first embodiment, however, only the path from the pin X to the pin C is listed as the worst path. The designer of the circuit can easily find that the path from the pin T1 to the pin T2 having the delay time Tα may be the culprit of the error. When the delay time Tα is shortened based on the above finding, the paths from the source FFs to the target FFs are made free from the errors all together.

Accordingly, it is easier to find a cause of the errors in the first embodiment, compared to an analysis based on the enormous amount of error information.

FIG. 6 shows another circuit diagram for explaining the process of extracting the worst paths by the error-path processing/display unit 14. In the figure, source FFs are denoted by FF1 through FF5, whose pins are denoted by V through Z, respectively. Also, target FFs are denoted by FF6 through FF8, whose pins are denoted by A through C, respectively. G refers to a gate.

There are four paths connected to the target pin A, i.e, paths from the pins V through Y to the pin A. Assume that the path from the pin Y to the pin A is the worst among those four paths. There are three paths connected to the target pin B, i.e, paths from the pins X through Z to the pin B. Assume that the path from the pin Z to the pin B is the worst among those three paths. Finally, there are two paths connecting the target pin C with the source pins Y and Z. Assume that the path from the pin Z to the pin C is the worst among the two. These worst paths are shown by thick lines.

Since the worst paths from the pin Z to the pin B and from the pin Z to the pin C have the same source pin Z, these two paths are compared to each other. Assume that the path from the pin Z to the pin C is the worst among the two.

Thus, the two paths from the pin Y to the pin A and from the pin Z to the pin C are selected as the representative paths. These paths are sorted according to indexes or delay times, and, then, are named on an error path list.

SECOND EMBODIMENT

A second embodiment of the present invention differs from the first embodiment in that the FFs are grouped in accordance with an instruction given by the designer. In the second embodiment, paths which have the longest total delay time are extracted as representative paths in the same manner as in the first embodiment. However, if there is at least one group of target FFs, the paths are extracted as representative paths for each group of the target FFs.

The extraction of the paths for one target group is made by selecting the worst path for each source pin from the worst error paths connected to a source pin, which worst error paths are determined for each target pin within the target group. Also, in the second embodiment, only selected paths among the extracted representative paths may be reported in the error path list, in accordance with the grouping of the FFs.

In FIG. 5, assume that the designer selects the target pins A through H (the target FFs FF4 through FF11) as one group. Then, the error-path processing/display unit 14 of FIG. 3 groups the pins A through H into a group #1.

When the delay time Tα of the path from the pin T1 to the pin T2 is too large, all the paths between the source FFs and the target FFs generate errors. Since the target pins A through H are included in the group #1, the worst path for each of the target pins A through H is selected first. The worst paths thus obtained have the same source pin X, so that these paths are compared with each other to select the worst of all. As a result, the path from the pin X to the pin C which has the largest delay time is extracted as a representative path. At this time, the path from the pin X to the pin C is output on an error path list with the name of the group #1.

Actually, there are three different cases in the second embodiment. A first case is that only the source FFs are grouped, a second case is that only the target FFs are grouped, and a third case is that both the source FFs and the target FFs are grouped, in accordance with an instruction given by the designer.

In FIG. 6, assume that the designer selects the source pins V through Y (the source FFs FF1 through FF4) as a group #1. Since only the source FFs FF1 through FF4 belong to the group #1, only the source pins V through Y are considered when reporting the representative paths on an error path list.

Since there is no group for the target FFs, the worst paths are obtained for all the target pins A through C. As in the first embodiment, the worst path for the pin A is the path from the pin Y to the pin A, the worst path for the pin B is the path from the pin Z to the pin B, and the worst path for the pin C is the path from the pin Z to the pin C. Since the worst paths for the pin B and the pin C have the same source pin Z, these paths are compared with each other. Then, the path from the pin Z to the pin C is selected as the representative path for the pins B and C, as in the first embodiment. Thus, at this point of time, there are two representative paths, i.e., the path from the pin Y to the pin A and the path from the pin Z to the pin C.

Since the group #1 does not include the source pin Z, the path from the pin Z to the pin C is not reported in an error path list. Thus, only the path from the pin Y to the pin A is named on the error path list with the name of the group #1.

As described here, when one or more groups are indicated by the designer, error paths for FFs which are not included in the groups are not reported in the error path list.

For example, the FF5 of FIG. 6 is not included in the group #1. Thus, the error path list for the circuit of FIG. 6 at an initial report does not contain the worst path for the target FF FF5, and only reports the path from the pin Y to the pin A. After the error of this path is corrected, the worst path for the FF5 will be included in a subsequent error path list.

In FIG. 6, assume that the designer selects the target pins A and B (the target FFs FF6 and FF7) as a group #2. Since only the target FFs FF6 and FF7 belong to the group #2, only the target pins A and B are considered in finding the representative paths.

The worst path connected to the pin A is the path from the pin Y to the pin A. Also, the worst path connected to the pin B is the path from the pin Z to the pin B. The pin C is not included in the group #2, so that no worst path is obtained for the pin C.

Thus, these two paths are selected as representative paths, and sorted according to indexes or delay times to be named on an error path list. The error path list also includes the name of the group #2.

In FIG. 6, assume that the designer selects the source pins V through Y (the source FFs FF1 through FF4) as a group #1 and the target pins A and B (the target FFs FF6 and FF7) as a group #2. Since only the target FFs FF6 and FF7 belong to the group #2, only the target pins A and B are considered in finding the representative paths.

The worst path connected to the pin A is the path from the pin Y to the pin A. Also, the worst path connected to the pin B is the path from the pin Z to the pin B. The pin C is not included in the group #2, so that no worst path is obtained for the pin C.

Since the group #1 does not include the source pin Z, the path from the pin Z to the pin B is not reported in an error path list. Thus, only the path from the pin Y to the pin A is named on the error path list with the names of the group #1 and the group #2.

FIGS. 7A through 7E are illustrative drawings showing the error path lists obtained for the circuit of FIG. 6 according to the prior art and the embodiments of the present invention.

FIG. 7A shows the error path list according to the prior art. As shown in FIG. 7A, when all the paths connecting the source pins V through Z with the target pins A through C are detected as errors, all these paths are reported in the error path list with corresponding delay times.

FIG. 7B shows the error path list according to the first embodiment. As shown in FIG. 7B, when there is no grouping of FFs, the path from the pin Y to the pin A and the path from the pin Z to the pin C are named on the error path list with corresponding delay times.

FIG. 7C shows the error path list according to the second embodiment when only the source FFs FF1 through FF4 are grouped into the group #1 as shown in FIG. 6. The error path list in this case includes only the path from the pin Y to the pin A with a corresponding delay time, because the pin Z is not included in the group #1. The name of the group #1 is also shown on the list.

FIG. 7D shows the error path list according to the second embodiment when only the target FFs FF6 and FF7 are grouped into the group #2 as shown in FIG. 6. In this case, only the target pins A and B are considered in finding the worst paths. Thus, the path from the pin Y to the pin A and the path from the pin Z to the pin B are reported in the error path list with corresponding delay times. The name of the group #2 also appears on the list.

FIG. 7E shows the error path list according to the second embodiment when the source FFs FF1 through FF4 and the target FFs FF6 and FF7 are grouped into the group #1 and the group #2, respectively, as shown in FIG. 6. Only the target pins A and B are considered in finding the worst paths, and, also, only the source pins V through Y are considered in reporting representative paths. Thus, only the path from the pin Y to the pin A appears on the error path list with a corresponding delay time. At this time, both group names of the group #1 and the group #2 are named on the list.

In the above, the paths may be sorted according to the delay times, or may be sorted according to the indexes such as V, X, Y, etc., identifying the pins.

FIGS. 8A through 8E are illustrative drawings showing error path lists obtained for the circuit of FIG. 6 under different conditions. These conditions are that the paths from the source pins V through Y to the target pins A and B are detected as errors, and that the worst path for the pin A is the path from the pin V and the worst path for the pin B is the path from the pin Y.

FIG. 8A shows the error path list according to the prior art. As shown in FIG. 8A, all the paths from the pins V through Y to the pins A and B are reported in the error path list with corresponding delay times.

FIG. 8B shows the error path list according to the first embodiment. As shown in FIG. 8B, when there is no grouping of FFs, the path from the pin V to the pin A and the path from the pin Y to the pin B are named on the error path lists with corresponding delay times.

FIG. 8C shows the error path list according to the second embodiment when only the source FFs FF1 through FF4 are grouped into the group #1 as shown in FIG. 6. The error path list in this case includes the same paths as those of FIG. 8B, because the paths on the error path list of FIG. 8B have the source pins within the group #1.

FIG. 8D shows the error path list according to the second embodiment when only the target FFs FF6 and FF7 are grouped into the group #2 as shown in FIG. 6. Only the target pins A and B are considered in finding the worst paths in this case. However, the resulting error path list is the same as those of FIGS. 8B and 8C.

FIG. 8E shows the error path list according to the second embodiment when the source FFs FF1 through FF4 and the target FFs FF6 and FF7 are grouped into the group #1 and the group #2, respectively, as shown in FIG. 6. Only the target pins A and B are considered in finding the worst paths, and, also, only the source pins V through Y are considered in reporting representative paths. However, the resulting error path list is the same as those of FIGS. 8B through 8D.

FIG. 9 is a flowchart of the process of extracting the representative paths by the error-path processing/display unit 14.

At a step S21, target pins considered in finding the worst paths are determined. In doing so, if there is no grouping of the target pins, all the target pins will be considered in finding the worst paths. If the target pins are grouped, all the target pins in each group will be considered group by group in finding the worst paths.

At a step S22, error pins are detected in a group of the target pins.

At a step S23, source pins which are connected to the error pins are determined.

At a step S24, a path with the longest delay is selected for each error pin, when there are a plurality of the source pins connected to an error pin. In selecting the path, first, paths starting from the plurality of the source pins and meeting at the same intermediate node are compared with each other so that a path having the longest delay up to that node is locally selected. The same local selection is repeated for all intermediate nodes relevant to a given error pin until only one path remains at a node nearest to the given error pin. The path thus obtained is the worst path.

At a step S25, the worst paths which have the same source pin are compared with each other, in order to select only one worst path for one source pin.

At a step S26, a check is made whether all the groups of the target pins are processed. If they are not, the procedure goes back to the step S21. If all the groups are finished, this is the end of the procedure.

As described above, the present invention has the following advantages.

In the first embodiment, paths with the longest delay time are extracted as representative paths by selecting the worst path for a source pin from worst error paths connected to the source pin, which worst error paths are obtained for each target pin. Thus, a path causing the errors can be easily found, which results in the number of steps for analysis being significantly reduced.

In the second embodiment, source FFs in a circuit may be grouped based on registers, functional blocks, LSI circuits, etc., to which the FFs belong, in accordance with an instruction given by a designer of the circuit. Then, paths with the longest delay time are extracted as representative paths. The selection of the paths is made by selecting the worst path for a source pin from worst error paths connected to the source pin, which worst error paths are obtained for each target pin. When the representative paths are reported in the error path list, only those which start from the source pins belonging to groups are reported with the names of the groups. Thus, the designer of the circuit can obtain the error path list which is organized in accordance with the grouping of the source FFs. This leads to an easy detection of a cause of the errors and to the number of steps for analysis being significantly reduced.

Also, in the second embodiment, target FFs may be grouped in accordance with an instruction given by the designer. Then, paths with the longest delay time are selected as representative paths for each group of the target FFs. Within a group, the selection of the representative paths is made in the same manner as in the first embodiment. The representative paths are reported in the error path list with the names of the groups. Thus, the designer can obtain the error path list which is organized in accordance with the grouping of the target FFs. This leads to an easy detection of a cause of the errors and to the number of steps for analysis being significantly reduced.

Furthermore, in the second embodiment, both the source FFs and the target FFs may be grouped in accordance with an instruction given by the designer. Then, paths with the longest delay time are selected as representative paths for each group of the target FFs. Within a group of the target FFs, the selection of the representative paths is made in the same manner as in the first embodiment. The representative paths which are connected to the grouped source FFs are reported in the error path list with the names of the source groups and the target groups. Thus, the designer can obtain the error path list which is organized in accordance with the grouping of the FFs. This leads to an easy detection of a cause of the errors and to the number of steps for analysis being significantly reduced.

Also, in the above embodiments, the representative paths can be sorted according to indexes or delay times, and, then, output as the error path list. Thus, it becomes easier to find the cause of the errors based on the error path list.

In the embodiments described above, the selection of the worst paths is made by selecting the worst path for a source pin from the worst error paths connected to the source pin, which worst error paths are determined for each target pin. In other words, first, each target pin is considered in finding the worst error paths. Then, each source pin is considered in selecting the worst paths from the worst error paths. In the present invention, the order of considering pins can be the other way around. That is, each source pin may be considered first to find the worst error paths, and each target pin may be considered next to select the worst paths from the worst error paths.

Further, the present invention is not limited to these embodiments, but various variations and modifications may be made without departing from the scope of the present invention.

What is claimed is:

1. A device for generating an error path list for analyzing delay times of paths generating errors, said paths connecting first nodes with second nodes, said device comprising:

reading means for reading information on said paths and said delay times thereof;

representative-path extraction means using said information for extracting from said paths representative paths which are worst in terms of said delay times, said representative-path extraction means comprising;

first means for determining a worst error path for a given one of said second nodes by selecting a path having the longest delay time among said paths connected to said given one of said second nodes, said first means selecting said worst error path for each of said second nodes; and second means for determining a representative path for a given one of said first nodes by selecting said worst error path having the longest delay time among more than one worst error path connected to said given one of said first nodes if more than one worst error path is connected to said given one of said first nodes, and by selecting said worst error path connected to said given one of said first nodes as said representative path if only one worst error path is connected to said given one of said first nodes, said representative path for all of said first nodes being said representative paths; and output means for generating said error path list reporting said representative paths.

2. The device as claimed in claim 1, wherein said error path list reports said representative paths in an order of either indexes identifying said representative paths or said delay times of said representative paths.

3. The device as claimed in claim 1, further comprising grouping means for making groups of said first nodes, wherein said error path list reports only said representative paths relating to said groups, and also reports corresponding names of said groups.

4. The device as claimed in claim 3, wherein said error path list reports said representative paths in an order of either indexes identifying said representative paths or said delay times of said representative paths for each of said groups.

5. The device as claimed in claim 1, further comprising grouping means for making groups of said second nodes, wherein said representative-path extraction means extracts said representative paths for each of said groups, and said error path list reports said representative paths with corresponding names of said groups.

6. The device as claimed in claim 5, wherein said error path list reports said representative paths in an order of either indexes identifying said representative paths or said delay times of said representative paths for each of said groups.

7. The device as claimed in claim 1, further comprising grouping means for making first groups of said first nodes and second groups of said second nodes, wherein said representative-path extraction means extracts said representative paths for each of said second groups, and said error path list reports only said representative paths relating to said first groups with corresponding names of said first groups and said second groups.

8. The device as claimed in claim 7, wherein said error path list reports said representative paths in an order of either indexes identifying said representative paths or said delay times of said representative paths for each of said first groups and for each of said second groups.

9. A method of extracting representative paths which are worst in terms of delay times among paths generating errors, said paths connecting first nodes with second nodes, said method comprising:

a) receiving information on said paths and said delay times thereof;

b) determining a worst error math for a given one of said second nodes by selecting a path having the longest delay time among said paths connected to said given one of said second nodes, said worst error path being selected for each of said second nodes; and c) determining a representative path for a given one of said first nodes by selecting said worst error path having the longest delay time among more than one worst error path connected to said given one of said first nodes if more than one worst error path is connected to said given one of said first nodes, and by selecting said worst error path connected to said given one of said first nodes as said representative oath if only one worst error path is connected to said given one of said first nodes, said representative path for all of said first nodes being said representative paths.

10. The method as claimed in claim 9, further comprising, before said step b), a step of making groups of said second nodes, wherein said step b) selects said worst error paths for each of said groups.

11. A method for performing delay time analysis of a logic circuit, comprising:
  (a) grouping nodes of the logic circuit into a plurality of node groups;
  (b) selecting a representative path for each possible pair of node groups using path delay times between the nodes to determine a worst delay path;
  (c) selecting a source node group and a target node group from the node groups; and
  (d) determining a representative path between said source node group and said target node group by,
    (d1) determining a first worst delay path by finding a longest delay path from a source pin to each source node of said source node group,
    (d2) determining a second worst delay path by finding a longest delay path from a target pin to each target node of said target node group, and
    (d3) determining said representative path by concatenating the first worst delay path and second worst delay path.

* * * * *

UNITED STATES PATENT AND TRADEMARK OFFICE
CERTIFICATE OF CORRECTION

PATENT NO. : 5,815,655
DATED : September 29, 1998
INVENTOR(S) : Akira KOSHIYAMA

It is certified that error appears in the above-identified patent and that said Letters Patent is hereby corrected as shown below:

On the Title Page, [56] insert --5,452,239  09/1995  Dai et al....371/22.2--.

Signed and Sealed this

Thirteenth Day of April, 1999

Attest:

Q. TODD DICKINSON

*Attesting Officer*          *Acting Commissioner of Patents and Trademarks*